United States Patent
Sato

(10) Patent No.: US 9,148,103 B2
(45) Date of Patent: Sep. 29, 2015

(54) GAIN MEASUREMENT CIRCUIT, GAIN MEASUREMENT METHOD, AND COMMUNICATION APPARATUS

(75) Inventor: Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 393 days.

(21) Appl. No.: 13/609,516

(22) Filed: Sep. 11, 2012

(65) Prior Publication Data

US 2013/0106398 A1    May 2, 2013

(30) Foreign Application Priority Data

Oct. 31, 2011  (JP) ................. 2011-238635

(51) Int. Cl.
  *H03G 3/30*  (2006.01)
(52) U.S. Cl.
  CPC .................... *H03G 3/3052* (2013.01)
(58) Field of Classification Search
  CPC .......... H04B 1/30; H04B 1/405; H04B 1/408; H04B 1/48; H03G 3/3052
  See application file for complete search history.

(56) References Cited

U.S. PATENT DOCUMENTS

| | | | | |
|---|---|---|---|---|
| 5,420,552 A | * | 5/1995 | Sakka | .................. 333/17.1 |
| 2010/0303184 A1 | | 12/2010 | Komori | |
| 2011/0076939 A1 | | 3/2011 | Sato | |

FOREIGN PATENT DOCUMENTS

| | | |
|---|---|---|
| JP | 2010-278896 A1 | 12/2010 |
| JP | 2011-24025 A1 | 2/2011 |
| JP | 2011-71914 A1 | 4/2011 |

* cited by examiner

*Primary Examiner* — Junpeng Chen
(74) *Attorney, Agent, or Firm* — Kratz, Quintos & Hanson, LLP

(57) ABSTRACT

A gain measurement circuit of a receiver includes a frequency mixer that receives a reception signal, mixes the reception signal with a local signal from an oscillator, and outputs an intermediate frequency signal; and a phase controller that extracts a part of the local signal, sets a different phase for the part, and outputs the part as the reception signal; wherein, for the different phase set by the phase controller, a direct-current voltage of the intermediate frequency signal output from the frequency mixer is detected, a conversion gain of the frequency mixer is obtained, and a gain of the receiver is calculated.

15 Claims, 7 Drawing Sheets

GAIN MEASUREMENT CIRCUIT, GAIN MEASUREMENT METHOD, AND COMMUNICATION APPARATUS

CROSS-REFERENCE TO RELATED APPLICATION(S)

This application is based upon and claims the benefit of priority of the prior Japanese Patent Application No. 2011-238635, filed on Oct. 31, 2011, the entire contents of which are incorporated herein by reference.

FIELD

The embodiments discussed herein are related to a gain measurement circuit, gain measurement method, and communication apparatus.

BACKGROUND

In recent years, systems using radio-frequency signals of a millimeter wave band (30 GHz to 300 GHz) such as, for example, car-mounted radar apparatuses or broad-band wireless LAN (local area network) devices have been provided. More specifically, car-mounted radar apparatuses use, for example, 77 GHz radio-frequency signals.

Recent semiconductor integrated circuits (IC) incorporate the BIST (built-in self-test) function, which inspects its own performance to reduce the cost for a pre-delivery inspection.

For ICs included in the above systems using radio-frequency signals of a millimeter wave band, however, an external measurement instrument such as a spectrum analyzer has to be used to measure, for example, the gain of a receiver, so it is difficult to reduce the cost for the inspection.

Conventionally, various ICs that, for example, inspect the performance of a receiver, perform demodulation at high precision, and are applicable to systems using radio-frequency signals of a millimeter wave band have been proposed.

[Patent document] Japanese Laid-open Patent Publication No. 2011-071914
[Patent document] Japanese Laid-open Patent Publication No. 2010-278896

As described above, an external measurement instrument such as a spectrum analyzer is used to measure the gain of a millimeter wave band receiver, thereby increasing the cost for, for example, a pre-delivery inspection.

The measurement of the gain of a receiver is useful not only for a pre-delivery inspection of an IC, but also for the power-on and use of an apparatus including the IC. That is, it is possible to install the automatic gain control function, which controls the gain of a receiver to a certain value, because the gain of the receiver is measured.

SUMMARY

According to an aspect of the invention, A gain measurement circuit of a receiver includes a frequency mixer that receives a reception signal, mixes the reception signal with a local signal from an oscillator, and outputs an intermediate frequency signal; and a phase controller that extracts a part of the local signal, sets a different phase for the part, and outputs the part as the reception signal; wherein, for the different phase set by the phase controller, a direct-current voltage of the intermediate frequency signal output from the frequency mixer is detected, a conversion gain of the frequency mixer is obtained, and a gain of the receiver is calculated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Before describing embodiments of a gain measurement circuit, gain measurement method, and communication apparatus in detail, examples of a communication apparatus and gain measurement circuit as well as problems with the gain measurement circuit will be described with reference to FIGS. 1 to 3.

Figure 1:
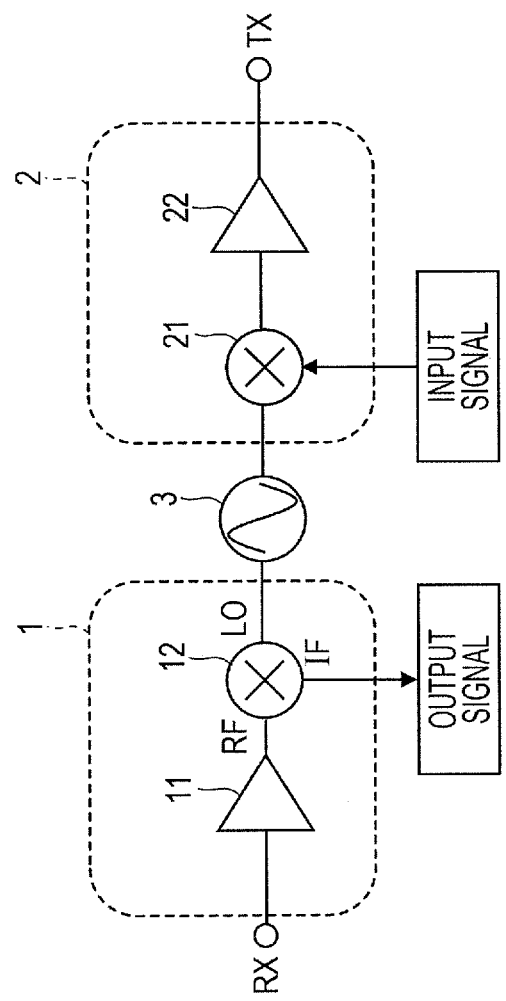
FIG. 1 is a block diagram depicting an example of a communication apparatus.

FIG. 1 is a block diagram depicting an example of a communication apparatus and schematically depicts, for example, a radio-frequency transceiver for a car-mounted radar apparatus. FIG. 1 depicts a receiver 1, a transmitter 2, and a radio-frequency oscillator (oscillator) 3.

As depicted in FIG. 1, the receiver 1 includes a low noise amplifier (LNA) 11 and a frequency mixer (mixer) 12. In the receiver 1, a reception signal RX, which is received, for example, through an antenna, is amplified by the LNA 11 and then demodulated by the mixer 12.

The mixer 12 receives a radio-frequency signal RF, which is generated by amplification of the reception signal RX by the LNA 11, and a local signal (carrier wave signal) LO from the oscillator 3, mixes the signals RF and LO, and outputs an intermediate frequency (IF) signal as an output signal.

That is, the mixer 12 outputs the difference frequency between the radio-frequency signal RF and the carrier wave signal LO as the IF signal.

The transmitter 2 includes a mixer 21 and a power amplifier (PA) 22. The mixer 21 receives an input signal and the carrier wave signal LO from the oscillator 3, and the input signal is modulated by the carrier wave signal LO, amplified by the PA 22, and transferred as a transmission signal TX from, for example, an antenna.

The gain measurement circuit according to the present embodiment, which will be described in detail later with reference to FIGS. 4 to 10, is applicable to the receiver 1 of the communication apparatus depicted in FIG. 1. This communication apparatus is not limited to a radio-frequency transceiver for a car-mounted radar apparatus and may be an apparatus for various types of communication such as broadband wireless LAN.

Figure 2A:
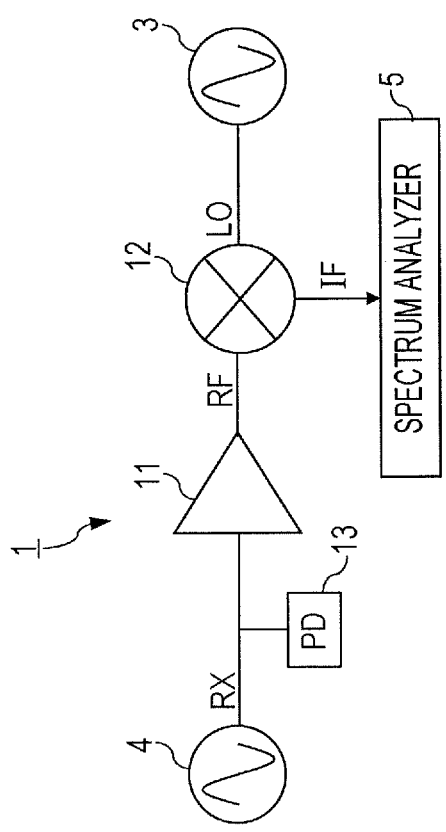
FIGS. 2A and 2B are diagrams for describing an example of a gain measurement circuit.
Figure 2B:
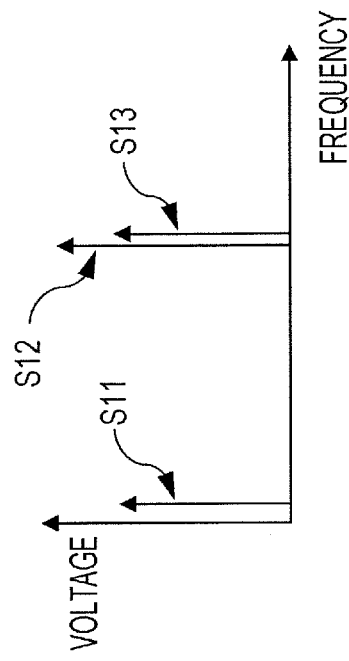

FIG. 2 is a diagram for describing an example of the gain measurement circuit. FIG. 2A depicts an example of the gain measurement circuit including an RX signal source 4, a power detector (PD) 13, and a spectrum analyzer 5 in addition to the receiver 1 in FIG. 1. FIG. 2B is a diagram for describing signal components included in the output signal (IF output) from the mixer 12.

The gain of the receiver 1 is represented by expression (1) below.

Gain of receiver=Level of signal IF/Level of signal RX (1)

That is, the gain of the receiver 1, for example, in FIG. 2A, may be obtained by measurement of the gain (amplification ratio) of LNA 11 and the conversion gain of the mixer 12 calculated by signal IF/signal RF.

Since frequency conversion is not performed, the amplification ratio of the LNA 11 may be easily obtained by using an envelope detector to measure the lever of the signal RF to be output with respect to the level of the signal RX to be input. For the mixer 12, however, it is difficult to measure the amplification ratio since frequency conversion is performed.

In the gain measurement circuit depicted in FIG. 2A, the voltage $V_{IF}$ of the IF output from the mixer 12 is represented by expression (2) below.

$$V_{IF} = A_{DC\text{-}offset} + A_{IF}\cos(|\omega_{LO}-\omega_{RF}|t) + A_{LO}\cos(\omega_{LO}t) + A_{RF}\cos(\omega_{RF}t) + \ldots \quad (2)$$

In expression (2) above, "$A_{DC\text{-}offset}$" represents a direct-current offset voltage and "$A_{IF}\cos(|\omega_{LO}-\omega_{RF}|t)$" represents the level of a signal including frequency components of the signal IF. In addition, "$A_{LO}\cos(\omega_{LO}t)+A_{RF}\cos(\omega_{RF}t)$" represents the level of a signal including frequency components of the carrier wave signal LO. Expression (2) includes signals including higher harmonic frequency components of the signal IF and the signal LO described above.

That is, as depicted in FIG. 2B, the IF output from the mixer 12 includes a signal S12 including the frequency components of the DC signal and carrier wave signal LO and a signal S13 including the frequency components of the signal RF in addition to an IF signal S11.

The conversion gain of the mixer 12 is represented by expression (3) below.

$$\text{Conversion gain of mixer} = \text{Level of signal IF}/\text{Power of signal RF} \quad (3)$$
$$= A_{IF}/P_{RF}$$

Since the IF output includes the signals S12, S13, etc. including the frequency components of the DC signal and other signals in addition to the IF signal S11 ($A_{IF}$), it is difficult to separate between these signals using, for example, an envelope detector.

$P_{RF}$ can be obtained on the basis of, for example, $P_{RX}$ measured by the PD 13 in FIG. 2A and the amplification ratio of the LNA 11. Of course, the PD 13 may be disposed at the output of the LNA 11 to directly measure $P_{RX}$.

As described above, in the gain measurement circuit depicted in FIG. 2A, frequency components have to be separated by, for example, the spectrum analyzer 5, so that the signal S11 ($A_{IF}$) in FIG. 2B is extracted from the IF output. In addition, since the carrier wave signal LO from the oscillator 3 differs from the reception signal RX in frequency, the RX signal source 4 for the reception signal RX has to be prepared separately from the oscillator 3, thereby increasing the cost for measuring the gain of the receiver.

Figure 3A:
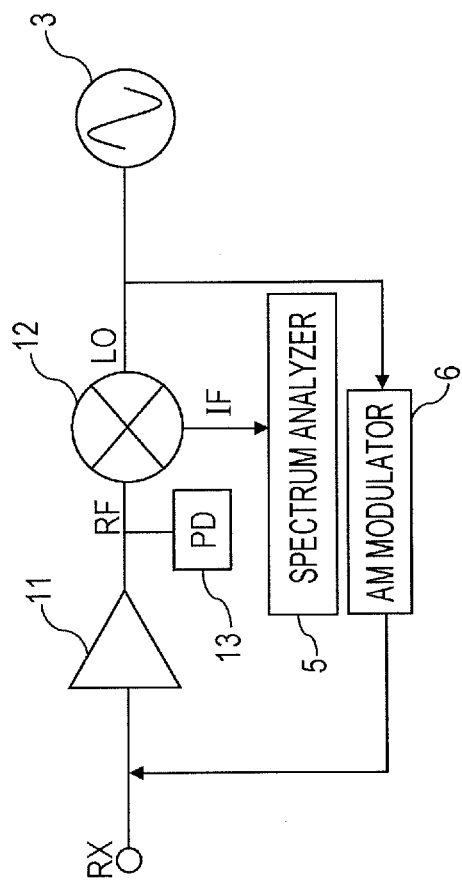
FIGS. 3A to 3C are diagrams for describing another example of a gain measurement circuit.

FIG. 3 is a diagram for describing another example of the gain measurement circuit. The other example of the gain measurement circuit in FIG. 3A has an AM modulator 6, which receives a part of a carrier wave signal LO from the oscillator 3 instead of the RX signal source 4 in the gain measurement circuit in FIG. 2 to perform amplitude modulation.

Figure 3C:
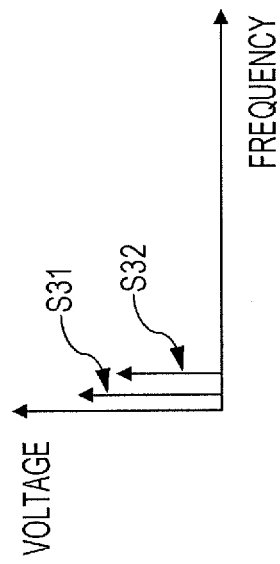
Figure 3B:
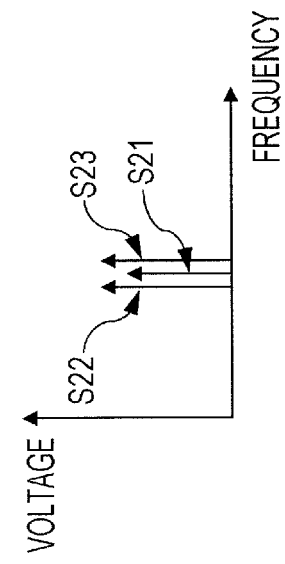

FIG. 3B is a diagram describing signal components included in an output signal (RF output) from the LNA 11. FIG. 3C is a diagram describing signal components included in the output signal (IF output) from the mixer 12.

In the other example of the gain measurement circuit depicted in FIG. 3A, the RX signal source 4 is not used, but the AM modulator 6 extracts a part of the carrier wave signal LO, applies AM modulation, and inputs the part to the receiver.

That is, a $\cos(\omega_{LO}+\omega_m)t$ signal and a $\cos(\omega_{LO}-\omega_m)t$ signal are generated by applying modulation at each frequency of $\omega_m$ using the AM modulator 6 and then these signals are multiplied by $\cos(\omega_{LO}t)$ by the carrier wave signal LO, so $\cos(\omega_m)t$ is output as the IF output.

In the gain measurement circuit depicted in FIG. 3A, the voltage $V_{IF}$ of the IF output from the mixer 12 is represented by expression (4) below.

$$\begin{aligned}V_{IF} &= (\cos((\omega_{LO}+\omega_m)t)+\cos((\omega_{LO}-\omega_m)t))\cdot\cos(\omega_{LO}t) \quad (4)\\ &= A_{offset}+A_{IF}\cos(\omega_m t)+A_{IF2}\cos(2\omega_m t)+\\ &\quad A_{image}\cos(\omega_{LO}-\omega_m)t\\ &= A_{LO}\cos(\omega_{LO}t)+A_{image2}\cos(\omega_{LO}+\omega_m)t+\ldots\end{aligned}$$

In expression (4) above, "$A_{offset}$" represents a direct-current offset voltage and "$A_{IF}\cos(\omega_m t)$" represents the level of a signal including the frequency components of the signal IF. In addition, "$A_{IF2}\cos(2\omega_m t)$" represents the level of an undesired signal caused by a leakage of the carrier wave signal LO. In addition, expression (4) includes "$A_{image}\cos(\omega_{LO}-\omega_m)t$", "$A_{LO}\cos(\omega_{LO}t)$", and signals including higher harmonic frequency components of signals described above.

That is, as depicted in FIG. 3B, the RF output from the LNA 11 includes a signal S21 caused by a leakage of the carrier wave signal LO in addition to signals S22 and S23 to which AM modulation have been applied by the AM modulator 6.

Accordingly, as depicted in FIG. 3C, in the IF output from the mixer 12, an IF signal S31, a direct-current offset voltage, signals including frequency components of the signals LO and RF, and signals including their higher harmonic frequency components (for example, a second harmonic wave ($\cos(2\omega_m t)$)) are mixed together.

Accordingly, the frequency components have to be separated by the spectrum analyzer 5 to obtain the conversion gain of the mixer 12, thereby increasing the cost for measuring the gain of the receiver.

Figure 4:
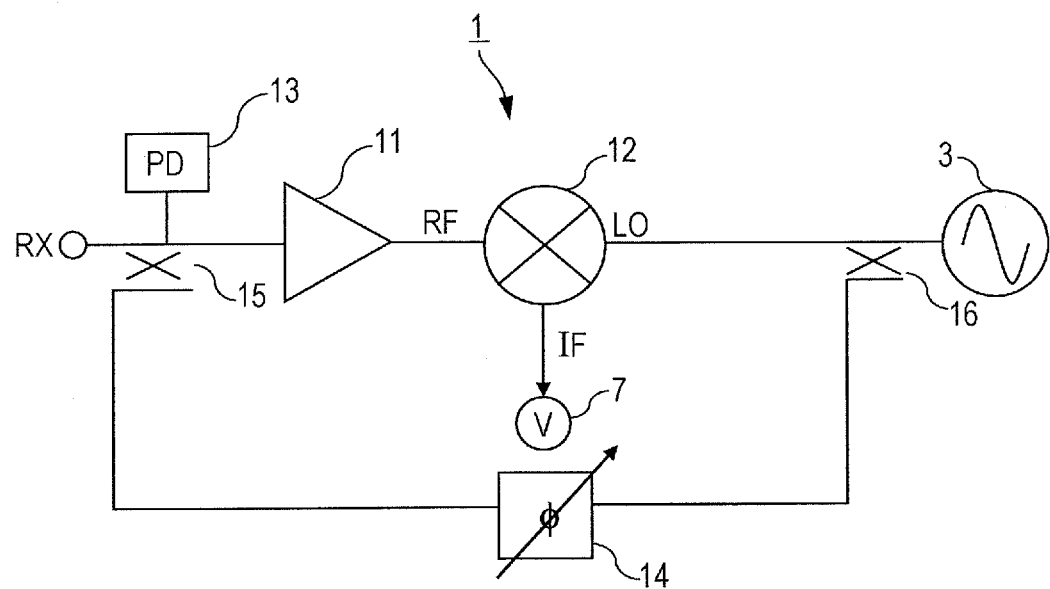
FIG. 4 is a block diagram illustrating the gain measurement circuit according to a first embodiment.

Embodiments of the gain measurement circuit, gain measurement method, and communication apparatus will be described in detail below with reference to the drawings. FIG. 4 is a block diagram illustrating the gain measurement circuit according to a first embodiment.

FIG. 4 depicts the oscillator (LO signal source) 3, a voltage measurement unit 7, the low noise amplifier (LNA) 11, the frequency mixer (mixer) 12, the power detector (PD) 13, a phase controller (variable phase shifter) 14, and couplers 15 and 16.

As depicted in FIG. 4, the gain measurement circuit according to the first embodiment extracts a part of the local signal LO from the LO signal source 3 via the coupler 16 and inputs the extracted signal to the variable phase shifter 14.

The variable phase shifter 14 changes the phase of the input signal (the part of LO) and inputs the part to the LNA 11 (receiver 1) via the coupler 15. The phase control by the variable phase shifter 14 of the signal input to the LNA 11 via the coupler 15 has only to be made so that at least two different phases excluding 180 degrees are achieved on theoretical grounds, as described later in detail.

The PD 13 is disposed at the input of the LNA 11 to detect the power of a signal input to the LNA 11. The voltage measurement unit 7 is disposed at a port of the mixer 12 from which an intermediate frequency (IF) is output to measure the direct-current voltage of an IF output from the mixer 12.

The voltage measurement unit 7 may include, for example, an analog-digital converter (A/D converter) instead of the direct-current (DC) voltage measurement circuit, which measures a direct-current voltage, so as to convert the analog level of the IF output into digital codes and output them.

For example, the voltage measurement unit (DC voltage measurement circuit or A/D converter) 7 may be included in a semiconductor integrated circuit (communication apparatus) in which the receiver 1 is formed or may be disposed outside the integrated circuit.

In the gain measurement circuit according to the first embodiment depicted in FIG. 4, the voltage $V_{IF}$ of the IF output from the mixer 12 is represented by expression (5) below.

$$V_{IF} = A_{DC\text{-}offset} + A_{IF} \cos(\phi) + (A_{LO} + A_{RF}) \cos(\omega_{LO} t) + \ldots \quad (5)$$

In expression (5) above, "$A_{DC\text{-}offset}$" represents a direct-current offset voltage and "$A_{IF} \cos(\phi)$" represents the voltage of the amplitude (maximum deviation from the center of the wave) of the signal IF. In addition, "$(A_{LO} + A_{RF}) \cos(\omega_{LO} t)$" represents the level of a signal including frequency components of the signal LO. Expression (4) also includes, for example, a signal including higher harmonic frequency components etc. of a signal including frequency components of the signal LO described above.

Here, "$A_{DC\text{-}offset}$" and "$A_{IF} \cos(\phi)$" ($A_{IF}$) are direct-current voltage components of the IF output ($V_{IF}$) and represented by the expression (6) below.

Direct-current voltage components of IF output=
$A_{DC\text{-}offset} + A_{IF} \cos(\phi)$ (6)

As depicted in expression (3) above, the conversion gain of the mixer is calculated by $A_{IF}/P_{RF}$. In the gain measurement circuit depicted in FIG. 4, $P_{RF}$ may be easily obtained on the basis of the result of detection by the PD 13, which detects the power of an input signal of the LNA 11, and the amplification of the LNA 11. Accordingly, if the amplitude "$A_{IF}$" of the signal IF is obtained, the conversion gain of the mixer, or the gain of the receiver may be calculated.

Figure 5:
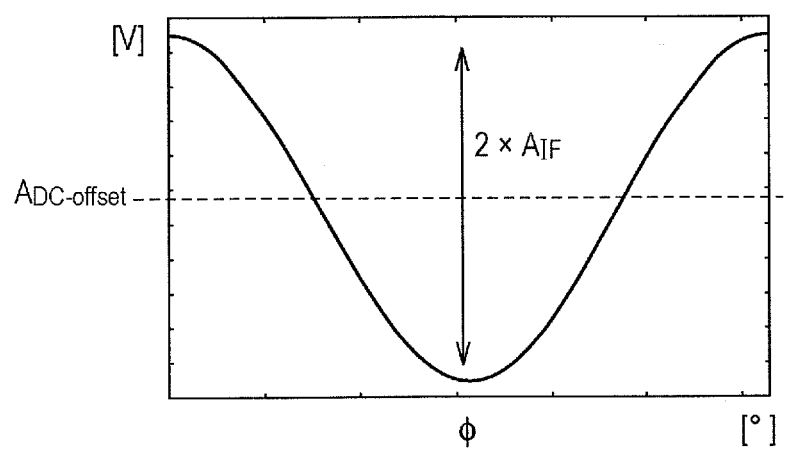
FIG. 5 is a graph for describing a method of calculating the gain of a receiver based on direct-current components of an IF port that are obtained from the gain measurement circuit depicted in FIG. 4.

FIG. 5 is a graph for describing a method of calculating the gain of the receiver based on the direct-current components of the IF port obtained by the gain measurement circuit depicted in FIG. 4.

As is clear from expression (6) above, to obtain the amplitude "$A_{IF}$" of the signal IF, the direct-current offset voltage "$A_{DC\text{-}offset}$", which is not related to the conversion gain of the mixer (gain of the receiver), is subtracted from "direct-current voltage components of the IF output".

That is, continuous changes of the phase ω by the variable phase shifter 14 gives the waveform depicted in FIG. 5. Based on this waveform, the average value of the direct-current offset voltage "$A_{DC\text{-}offset}$" and the amplitude "$A_{IF}$" ($2 \times A_{IF}$) of the signal IF may be obtained.

More specifically, since the differential voltage between the maximum amplitude and the minimum amplitude is "$2 \times A_{IF}$" in the waveform depicted in FIG. 5, $A_{IF}$ may be obtained as ("direct-current voltage components of the IF output"—"$A_{DC\text{-}offset}$")/2. In the control of the phase φ by the variable phase shifter 14, the phase φ does not have to be changed continuously and only changes to two different phases excluding 180 degrees give $A_{IF}$ on logical grounds.

This is because, in expression (6), since "direct-current voltage components of the IF output" is measured by the voltage measurement unit 7, variables are "$A_{IF}$" and "$A_{DC\text{-}offset}$" only and the two variables may be determined by giving two different phases (functions) φ excluding known 180 degrees.

If the amplitude "$A_{IF}$" is obtained, the conversion gain of the mixer 12 and the gain of the receiver 1 may be calculated. That is, the gain of the receiver may be calculated without using the external signal source (RX signal source) 4 in FIG. 2A and the spectrum analyzer 5 in FIGS. 2A and 3A, which are described above.

If the gain of the receiver may be measured by using the BIST function of the semiconductor integrated circuit in which the receiver is formed without using, for example, the spectrum analyzer etc. as described above, the cost for a pre-delivery inspection may be reduced.

In addition, if the gain of the receiver is measured during the power-on or use of the apparatus that uses the receiver, the automatic gain control (AGC) function for controlling the gain of the receiver may be achieved, for example.

Figure 6:
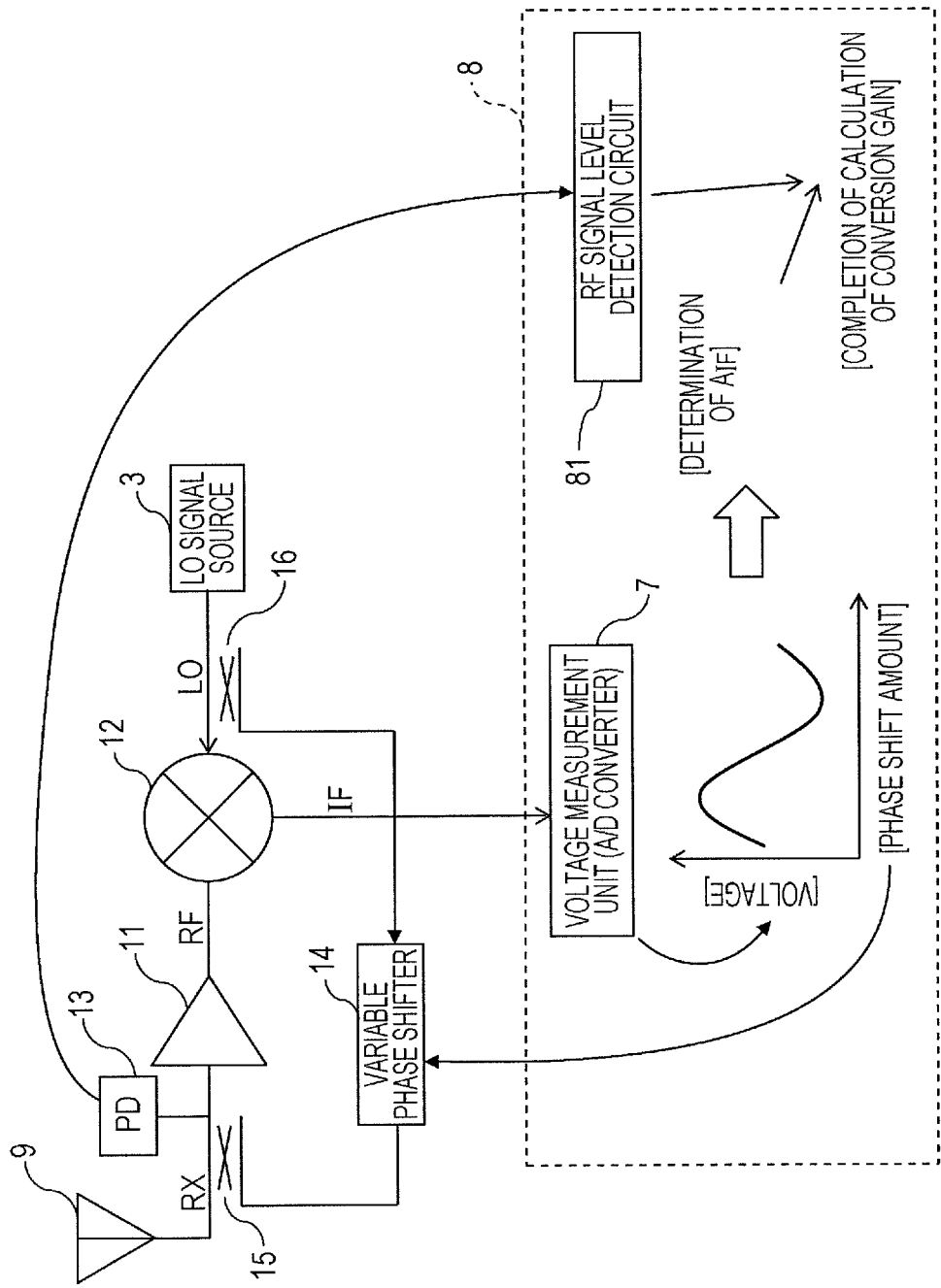
FIG. 6 depicts a processing routine of a gain measurement method by the gain measurement circuit according to the first embodiment.

FIG. 6 depicts a processing routine of the gain measurement method by the gain measurement circuit according to the first embodiment, and it also depicts a conversion gain calculation circuit 8 together.

The conversion gain calculation circuit 8 includes the voltage measurement unit (DC voltage measurement circuit) or the A/D converter 7, which is described above and depicted in FIG. 5, and an RF signal level detection circuit 81. The input of the LNA 11 is connected to an antenna 9 through which the reception signal RX is received.

The conversion gain calculation circuit 8 changes the phase at the variable phase shifter 14 continuously or to two different phases excluding 180 degrees, and measures the direct-current voltage of the IF output from the mixer 12 using the voltage measurement unit 7.

The RF signal level detection circuit 81 detects (calculates) the level $P_{RF}$ of the signal RF based on the power of the signal RX detected by the PD 13, the amplification of the LNA 11, etc. In addition, the conversion gain calculation circuit 8 obtains the conversion gain of the mixer 12 based on the amplitude "$A_{IF}$" of the signal IF and the level $P_{RF}$ of the signal RF, as described with reference to FIG. 5.

In the above description, the conversion gain calculation circuit 8 may be built into the receiver 1 or the semiconductor integrated circuit (IC) in which the transceiver is formed or may be configured as a separate circuit.

Figure 7:
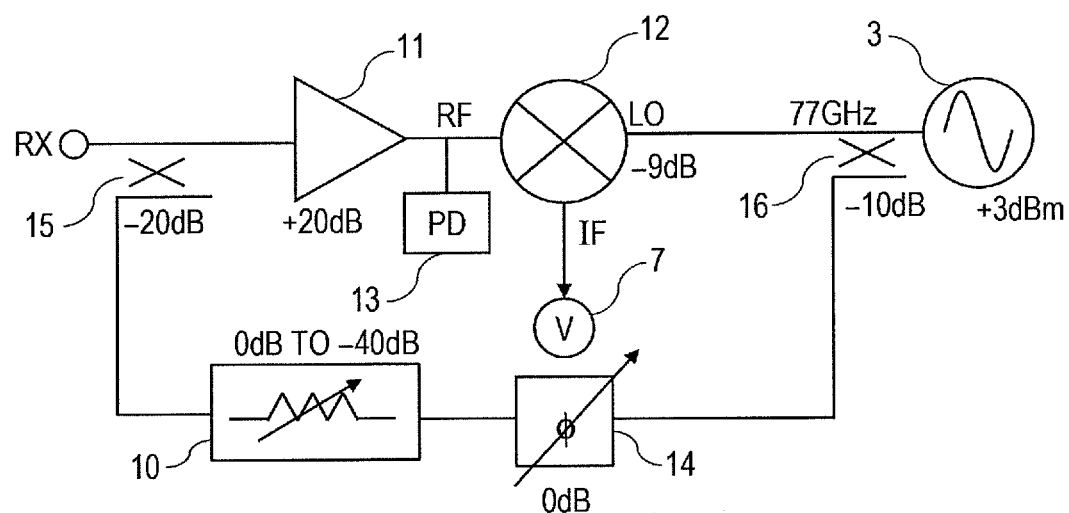
FIG. 7 is a diagram for describing simulation conditions for the gain measurement circuit depicted in FIG. 4.
Figure 8:
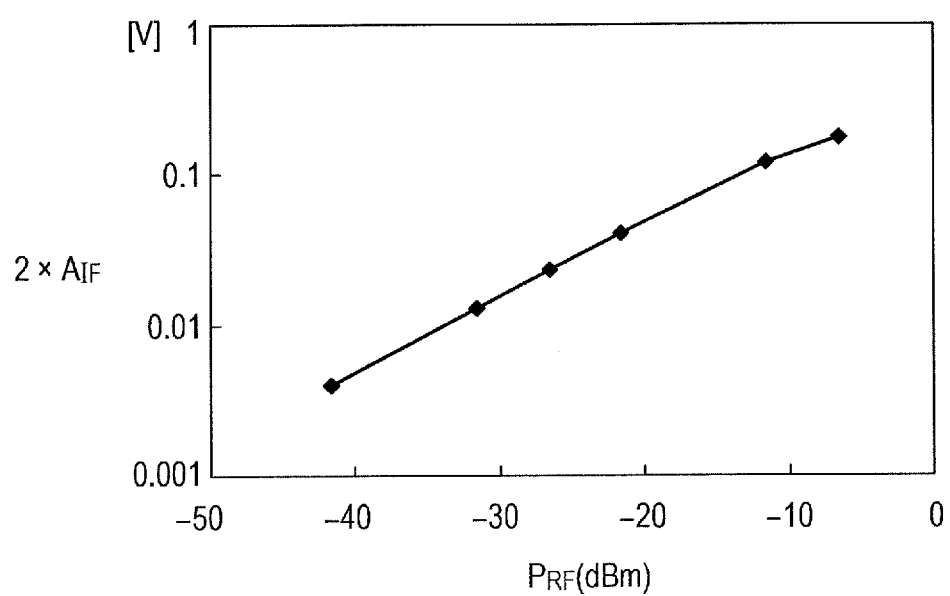
FIG. 8 depicts simulation results obtained from the gain measurement circuit under the simulation conditions depicted in FIG. 7.

FIG. 7 is a diagram for describing simulation conditions for the gain measurement circuit depicted in FIG. 4; FIG. 8 depicts simulation results obtained from the gain measurement circuit under the simulation conditions depicted in FIG. 7.

As depicted in FIG. 7, it was assumed as the simulation conditions that the LO signal source 3 output a radio-frequency signal LO of 77 GHz and +3 dBm and the couplers 15 and 16 had coupled gains of −20 dB and −10 dB, respectively. It was also assumed that the phase shift amount by the variable phase shifter 14 was 0 to 180 degrees and the gain was 0 dB.

Simulation was performed by insertion of a variable attenuator 10 with an attenuation of 0 dB to −40 dB and a phase shift amount of 0 degrees between the variable phase shifter 14 and the coupler 15.

More specifically, the power $P_{RF}$ at the output of the LNA 11 was detected by the PD 13 with the attenuation of the variable attenuator 10 assumed to be −40 dB and the phase shift amount by the variable phase shifter 14 assumed to be 0 degrees. In addition, the phase is changed successively by the variable phase shifter 14 and the direct-current voltage level of the IF output from the mixer 12 at that time was measured by the voltage measurement unit 7.

With this, the amplitude ($2 \times A_{IF}$) when the attenuation of the variable attenuator 10 is −40 dB, or "$2 \times A_{IF}$" when $P_{RF}$ equals −47 (=3−10+0−40−20+20) dBm is plotted. In addition, the same processing was performed while the attenuation of the variable attenuator 10 was changed from −40 dB to 0 dB successively, and the simulation results depicted in FIG. 8 were obtained.

As is clear from FIG. 8, it was found that the amplitude "$2 \times A_{IF}$" of the signal IF (that is, the direct-current component of the signal IF) output from the mixer 12 increased as the level of the signal RF (that is, the level of the reception signal RX) increased.

Figure 9:
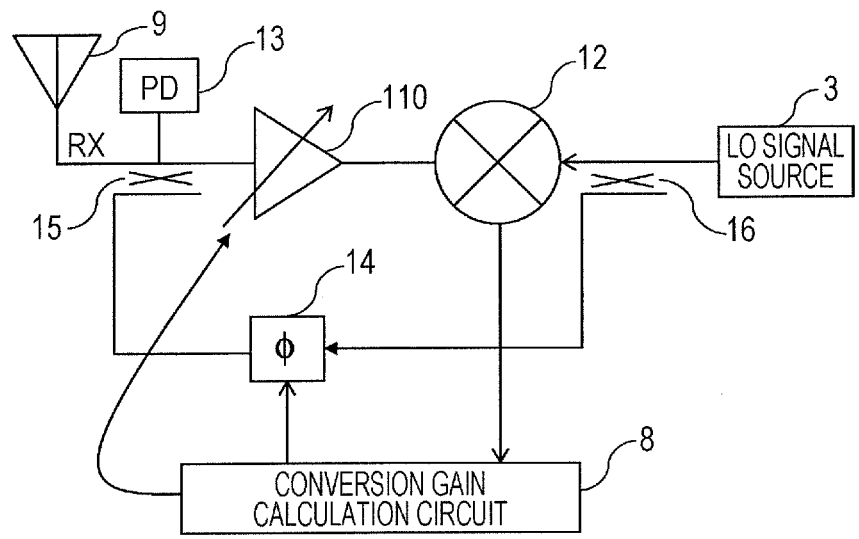
FIG. 9 is a block diagram illustrating the gain measurement circuit according to a second embodiment.

FIG. 9 is a block diagram illustrating the gain measurement circuit according to a second embodiment. In the gain measurement circuit according to the second embodiment, a LNA 110 whose amplification is variable is used as the low noise amplifier; based on the output from the conversion gain calculation circuit 8, the amplification of the LNA 110 is increased when the conversion gain of the mixer 12 is low and the amplification of the LNA 110 is reduced when the conversion gain is high so that the conversion gain is controlled to a certain value.

That is, the AGC function of controlling the gain of the receiver to a certain value is achieved by reducing the amplification of the LNA 110 when the gain of the receiver is high and increasing the amplification of the LNA 110 when the gain of the receiver is low.

If the conversion gain calculation circuit 8 is built into the semiconductor integrated circuit in which the receiver or transceiver is formed, the semiconductor integrated circuit including the AGC function of controlling the gain of the receiver to a certain value may be provided.

This improves the yield of the semiconductor integrated circuit in which the receiver or transceiver is formed, thereby increasing the added value of the semiconductor integrated circuit.

Figure 10:
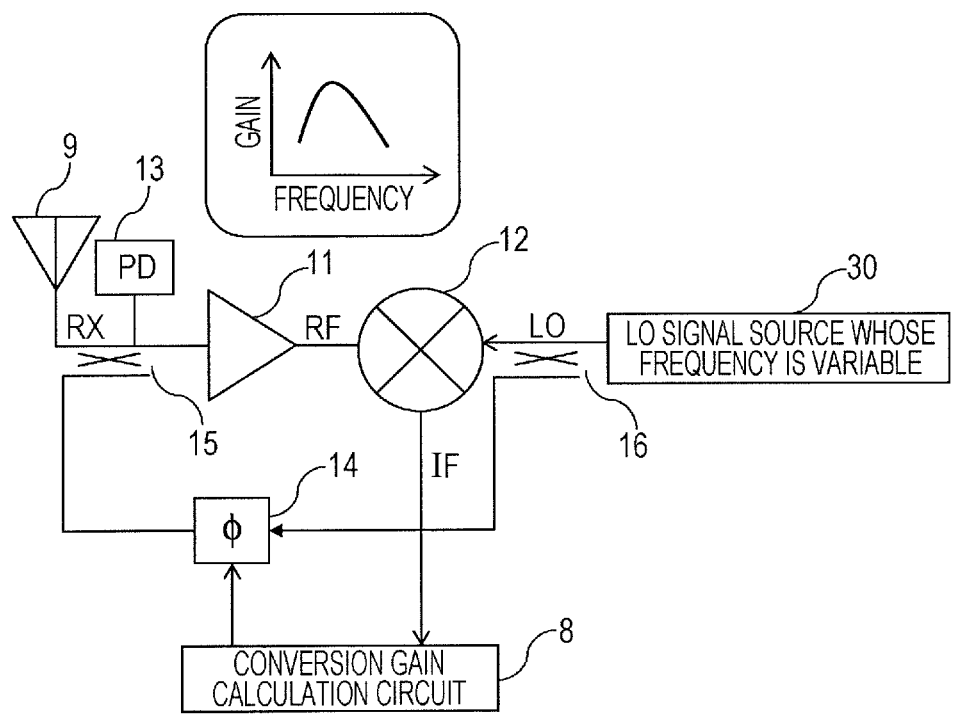
FIG. 10 is a block diagram illustrating the gain measurement circuit according to a third embodiment.

FIG. 10 is a block diagram illustrating the gain measurement circuit according to a third embodiment in which a LO signal source 30 whose frequency is variable is used as the oscillator (LO signal source). That is, the gain measurement circuit according to the third embodiment may measure the gain relative to different frequencies by changing the frequency of the LO signal using the LO signal source 30 whose frequency is variable.

For example, the LNA 11 or the mixer 12 generally has a different gain depending on the frequency of a signal (RX, RF, or LO) received and is configured, for example, to have the maximum gain at a designed frequency.

This enables various changes and control as in the gain measurement circuit according to the third embodiment, such as calculating the gain of the receiver by changing the frequency of the signal LO and using the gain to adjust the settings of circuits or change the settings.

The above communication apparatus is not limited to a radio-frequency transceiver for a car-mounted radar apparatus and may be an apparatus for various types of communication such as broad-band wireless LAN by which, for example, the cost and time for a pre-delivery inspection may be reduced using the BIST function.

In addition, if the gain of the receiver is measured during the power-on or use of the apparatus that uses the receiver, the automatic gain control (AGC) function for controlling the gain of the receiver may be achieved, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A gain measurement circuit of a receiver, comprising:
a frequency mixer that receives a reception signal, mixes the reception signal with a local signal from an oscillator, and outputs an intermediate frequency signal; and
a phase controller that extracts a first part of the local signal, sets a different phase for the first part, and outputs a second part as the reception signal, the second part having been phase-shifted;
wherein, for the different phase set by the phase controller, a direct-current voltage of the intermediate frequency signal output from the frequency mixer is detected, a conversion gain of the frequency mixer is obtained, and a gain of the receiver is calculated.

2. The gain measurement circuit according to claim 1, wherein the phase controller includes a variable phase shifter that shifts a phase of the part of the local signal to at least two different phases excluding 180 degrees.

3. The gain measurement circuit according to claim 2, further comprising:
a first combiner that extracts the part of the local signal and outputs the first part to the variable phase shifter; and
a second combiner that outputs a part of an output signal from the variable phase shifter as the reception signal.

4. The gain measurement circuit according to claim 2, wherein the variable phase shifter continuously shifts a phase of the part of the local signal.

5. The gain measurement circuit according to claim 1, further comprising:
a low noise amplifier that amplifies the reception signal and outputs the reception signal to the frequency mixer.

6. The gain measurement circuit according to claim 5, further comprising:

a power detector that detects power of the reception signal or an output signal from the low noise amplifier.

7. The gain measurement circuit according to claim 6, further comprising:
a voltage measurement unit that measures the direct-current voltage of the intermediate frequency signal output from the frequency mixer; and
a conversion gain calculation circuit that calculates the conversion gain of the frequency mixer based on an output from the voltage measurement unit, an output from the power detector, and a phase set by the variable phase shifter.

8. The gain measurement circuit according to claim 7, wherein the voltage measurement unit is a direct-current voltage measurement circuit or an analog-digital converter.

9. The gain measurement circuit according to claim 7, wherein
an amplification of the low noise amplifier is variable and
the conversion gain calculation circuit controls a gain of the receiver to a certain value by changing the amplification of the low noise amplifier.

10. The gain measurement circuit according to claim 7, wherein
an oscillation frequency of the oscillator is variable and
a characteristic of the gain of the receiver with respect to a frequency of the reception signal is obtained by changing the oscillation frequency of the oscillator.

11. A method of measuring a gain of a receiver having a frequency mixer that receives a reception signal, mixes the reception signal with a local signal from an oscillator, and outputs an intermediate frequency signal, the method comprising:
extracting a first part of the local signal, setting at least two different phases excluding 180 degrees for the first part, and outputting a second part as the reception signal, the second part having been phase-shifted;
detecting a direct-current voltage of the intermediate frequency signal output from the frequency mixer for the at least two different phases;
measuring power of the reception signal or an output signal from the low noise amplifier that amplifies the reception signal; and
measuring the gain of the receiver by calculating the conversion gain of the frequency mixer based on the direct-current voltage of the intermediate frequency signal, the set at least two different phases, and the power of the reception signal or the output signal from the low noise amplifier.

12. The method of measuring the gain according to claim 11, wherein
an amplification of the low noise amplifier is variable and
the gain of the receiver is controlled to a certain value by changing the amplification of the low noise amplifier according to the calculated conversion gain.

13. The method of measuring the gain according to claim 11, wherein
an oscillation frequency of the oscillator is variable and
a characteristic of the gain of the receiver with respect to a frequency of the reception signal is obtained by changing the oscillation frequency.

14. A communication apparatus comprising:
a receiver including the gain measurement circuit of a receiver; and
a transmitter that sends a transmission signal,
wherein a gain measurement circuit includes:
a frequency mixer that receives a reception signal, mixes the reception signal with a local signal from an oscillator, and outputs an intermediate frequency signal; and
a phase controller that extracts a first part of the local signal, sets a different phase for the first part, and outputs a second part as the reception signal, the second part having been phase-shifted;
wherein, for the different phase set by the phase controller, a direct-current voltage of the intermediate frequency signal output from the frequency mixer is detected, a conversion gain of the frequency mixer is obtained, and a gain of the receiver is calculated.

15. The communication apparatus according to claim 14, wherein the communication apparatus is one semiconductor integrated circuit.

* * * * *